(12) United States Patent
Moret et al.

(10) Patent No.: US 7,960,190 B2
(45) Date of Patent: Jun. 14, 2011

(54) TEMPORARY PACKAGE FOR AT-SPEED FUNCTIONAL TEST OF SEMICONDUCTOR CHIP

(75) Inventors: Eric J. M. Moret, Beaverton, OR (US); Pooya Tadayon, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 12/333,842

(22) Filed: Dec. 12, 2008

(65) Prior Publication Data

US 2010/0151598 A1 Jun. 17, 2010

(51) Int. Cl.
*H01L 21/66* (2006.01)
*H01L 23/34* (2006.01)
(52) U.S. Cl. .......... 438/15; 438/14; 257/E21.529; 257/E23.08

(58) Field of Classification Search .............. 438/14, 438/15; 324/760, 757.04
See application file for complete search history.

(56) References Cited

U.S. PATENT DOCUMENTS 6,744,269 B1 * 6/2004 Johnson et al. ............ 324/760
2008/0238460 A1 10/2008 Chi et al.

* cited by examiner

*Primary Examiner* — Alexander G Ghyka
(74) *Attorney, Agent, or Firm* — David L. Guglielmi

(57) ABSTRACT

In some embodiments, a temporary package for at-speed functional test of semiconductor chip, including high power chips, is presented. In this regard, a method is introduced including placing an integrated circuit die on a contactor layer, the contactor layer to electrically couple contacts on the integrated circuit die with contacts on a multi-layer substrate designed to be permanently attached with the integrated circuit die, placing an integrated heat spreader over the integrated circuit die, and bonding the integrated heat spreader with the substrate, the integrated heat spreader holding the integrated circuit die in place to form a temporary package. Other embodiments are also disclosed and claimed.

13 Claims, 2 Drawing Sheets

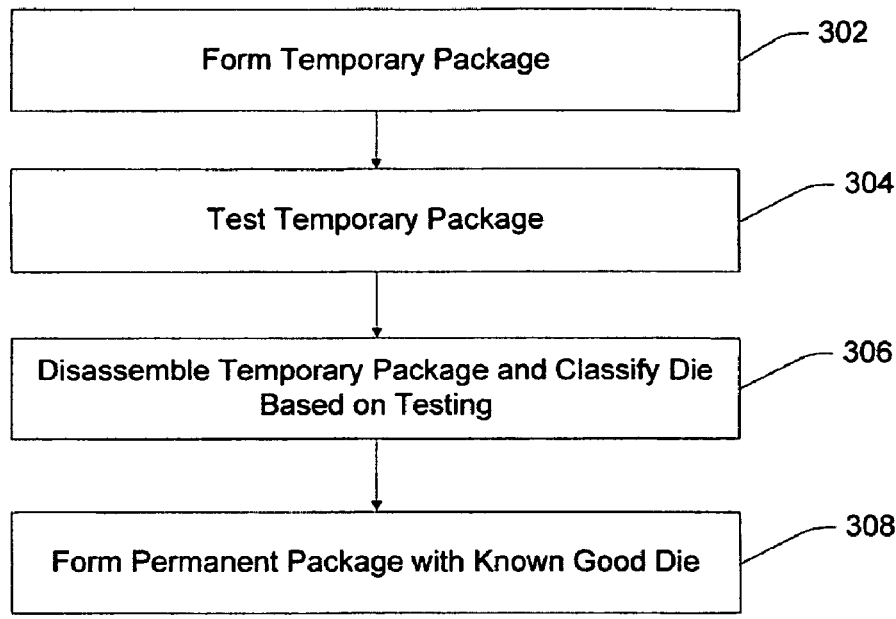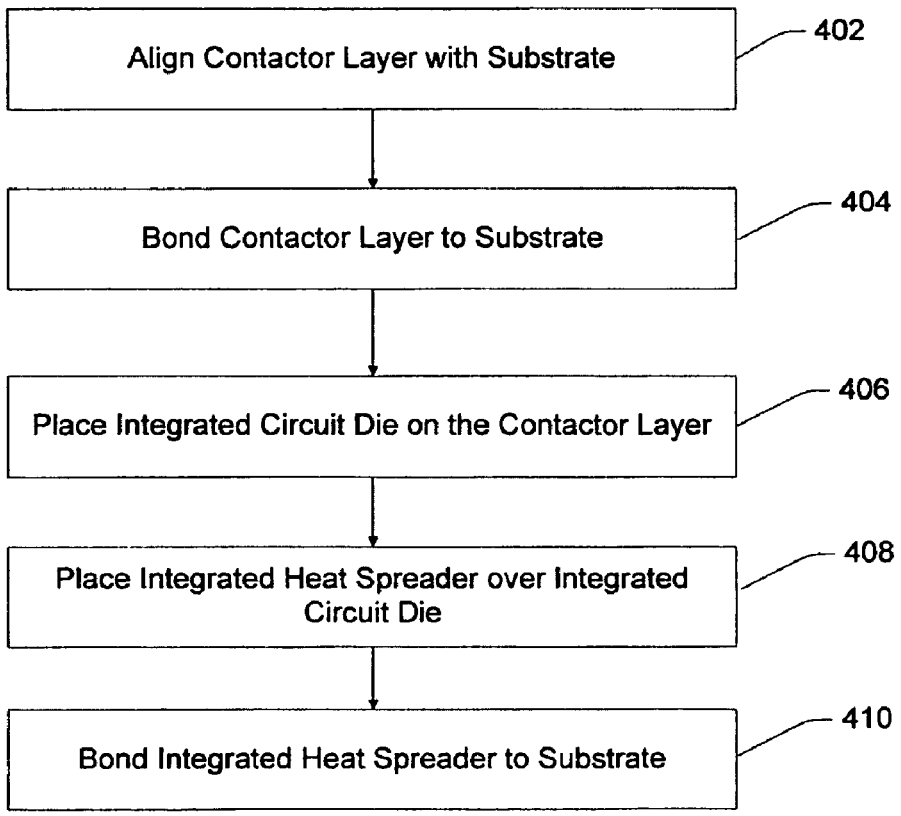

TEMPORARY PACKAGE FOR AT-SPEED FUNCTIONAL TEST OF SEMICONDUCTOR CHIP

FIELD OF THE INVENTION

Embodiments of the present invention generally relate to the field of integrated circuit functional test, and, more particularly to a temporary package for at-speed functional test of complex VLSI (high or low power) semiconductor chip.

BACKGROUND OF THE INVENTION

Integrated circuit devices, such as high power semiconductor chips, are typically formed into a package by permanently bonding the die to a package substrate. At-speed functional testing of the completed package is an effective way of discovering defects in and characterizing the performance of the die, however at that point there will be a significant financial loss in manufacturing a package that is ultimately discarded. This is especially true in the case of multi-chip packages where one bad die could result in discarding the other potentially good dice. Ideally, functional testing should be done on the die and only a known good die would be manufactured into a package or sold as a bare die.

BRIEF DESCRIPTION OF THE DRAWINGS

The present invention is illustrated by way of example and not limitation in the figures of the accompanying drawings in which like references indicate similar elements, and in which:

FIG. 3 is a flowchart of an example method of at-speed functional testing of a high power semiconductor chip using a temporary package, in accordance with one example embodiment of the invention; and FIG. 4 is a flowchart of an example method of forming a temporary package, in accordance with one example embodiment of the invention.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
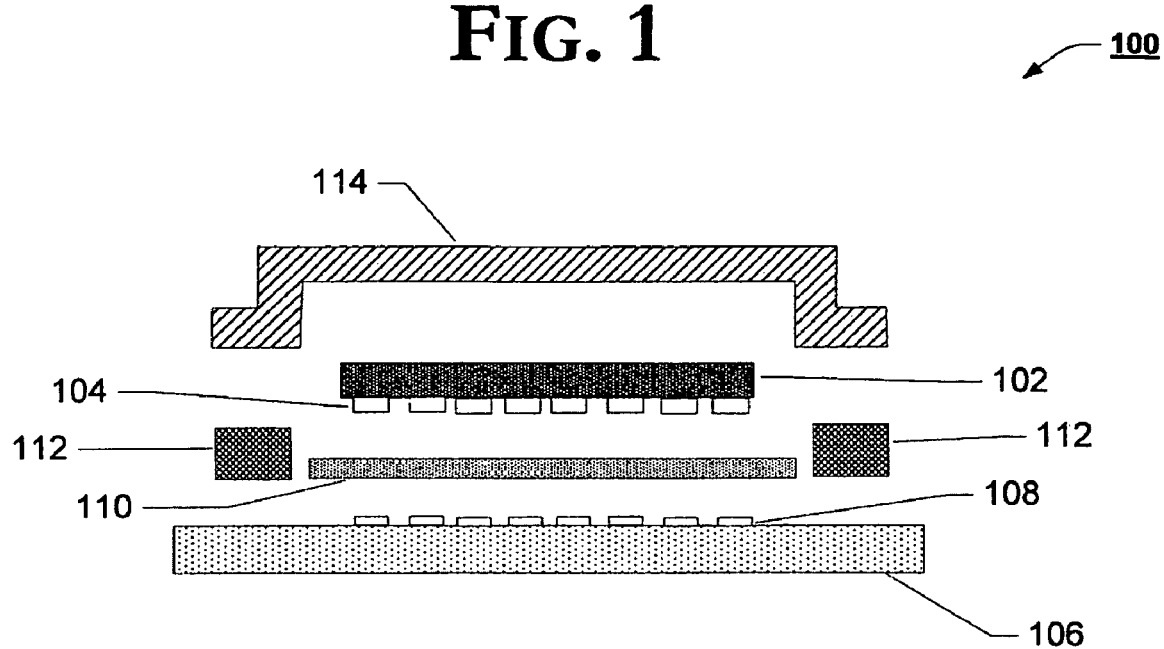
FIG. 1 is a graphical illustration of an exploded view of an example temporary package, in accordance with one example embodiment of the invention.

FIG. 1 is a graphical illustration of an exploded view of an example temporary package, in accordance with one example embodiment of the invention. In accordance with the illustrated example embodiment, temporary package 100 includes one or more of integrated circuit die 102, die contacts 104, package substrate 106, substrate contacts 108, contactor layer 110, attach mechanism 112 and integrated heat spreader 114, as shown in FIG. 1.

Integrated circuit die 102 represents a high power semiconductor chip. In one embodiment, integrated circuit die 102 represents a microprocessor or microcontroller. In one embodiment, integrated circuit die 102 represents a system on a chip. In one embodiment, integrated circuit die 102 represents a flip-chip die with die contacts 104 on an active surface of the die.

Package substrate 106 represents a multi-layer substrate designed to be permanently attached with integrated circuit die 102. In one embodiment, package substrate 106 represents a multi-layer organic substrate produced in high volume for use in production integrated circuit packages. Package substrate 106 includes substrate contacts 108 designed to be soldered to die contacts 104. In addition to substrate contacts 108, package substrate 106 includes contacts on an opposing side (not shown), such as lands or pins or balls, for example, for coupling with a socket or printed circuit board.

Contactor layer 110 represents an insulating material with conductive elements to electrically couple die contacts 104 with substrate contacts 108 while integrated circuit die 102 is pressed against package substrate 106. In one embodiment, contactor layer 110 represents a polymer sheet containing metal beads. In one embodiment, the conductive elements in contactor layer 110 are of a finer pitch than die contacts 104. In one embodiment, contactor layer 110 is affixed to package substrate 106, for example with adhesive (not shown), to allow for easier interchanging of integrated circuit die 102.

Integrated heat spreader 114 represents a thermally conductive material for contacting with, and spreading heat from, integrated circuit die 102. In one embodiment, integrated heat spreader 114 is made of copper and is produced in high volume for use in production integrated circuit packages. In one embodiment, an additional thermal interface is present on the die side of 114. After being pressed down on integrated circuit die 102 to conductively couple integrated circuit die 102 with package substrate 106, integrated heat spreader may be held in place by attach mechanism 112. In one embodiment, attach mechanism 112 represents an adhesive. In another embodiment, attach mechanism 112 represents screws or pins. In another embodiment, attach mechanism 112 represents magnets. In another embodiment, attach mechanism 112 represents vacuum-based/suction points.

Figure 2:
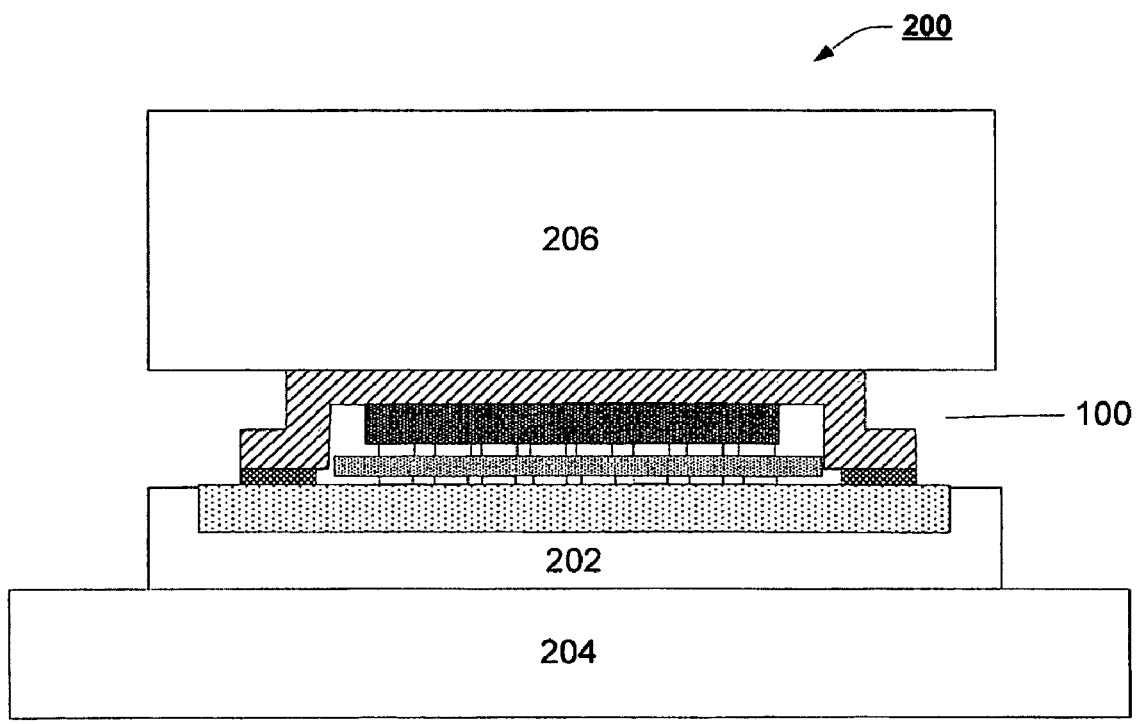
FIG. 2 is a graphical illustration of an example test system for a temporary package, in accordance with one example embodiment of the invention.

FIG. 2 is a graphical illustration of an example test system for a temporary package, in accordance with one example embodiment of the invention. In accordance with the illustrated example embodiment, test system 200 includes one or more of temporary package 100, tester socket 202, tester platform 204, and active thermal control 206, as shown in FIG. 2.

Assembled temporary package 100 is placed in tester socket 202 to temporarily couple temporary package 100 with tester platform 204 for functional testing. Tester platform 204 may include various system components necessary for running tests, such as, for example chipsets, memory devices, buses, I/O bridges, I/O devices, etc. In one embodiment, tester platform 204 is able to test integrated circuit die 102 at a higher frequency than a bin frequency at which integrated circuit die 102 is to be marketed. In another embodiment, tester platform 204 is able to test signal quality through each of die contacts 104.

Active thermal control 206 contacts integrated heat spreader 114 and is able to add heat to or remove heat from temporary package 100 as part of process to test the thermal tolerance of integrated circuit die 102.

FIG. 3 is a flowchart of an example method of at-speed functional testing of a high power semiconductor chip using a temporary package, in accordance with one example embodiment of the invention. As shown, method 300 begins with forming temporary package 100 (302). An example method of forming a temporary package is described below in reference to FIG. 4.

Next, temporary package 100 is tested (304). In one embodiment, temporary package 100 is placed in tester socket 202 of tester platform 204 and high speed functional tests are run to qualify integrated circuit die 102 as a known good die. In one embodiment, as part of the testing process, active thermal control 206 is placed on temporary package 100 and a thermal tolerance of integrated circuit die 102 is tested. In one embodiment, integrated circuit die 102 is tested at a higher frequency than a bin frequency at which integrated circuit die 102 is to be marketed. In one embodiment, tester platform 204 tests signal quality through each of die contacts 104.

Temporary package 100 is then disassembled (306) and integrated circuit die 102 is classified based on results from the testing. In one embodiment, temporary package 100 is disassembled by pulling or prying integrated heat spreader 114 off package substrate 106 and integrated circuit die 102 is then picked up by a suction device. The contactor layer 110 and package substrate 106 combination may be reused by reforming temporary package 100 with another integrated circuit die 102. Integrated circuit die 102 may be classified as a known good die if the test results are satisfactory. In one embodiment, an integrated circuit die 102 that does not pass testing at a certain frequency, may be classified as a known good die of a lower frequency at which integrated circuit die 102 did pass testing.

Finally, known good dice are formed (308) into permanent packages. In one embodiment, a known good integrated circuit die 102 is soldered to another instance of package substrate 106 to form a permanent package. In another embodiment, known good dice are sold as bare dice.

FIG. 4 is a flowchart of an example method of forming a temporary package, in accordance with one example embodiment of the invention. As shown, method 302 begins with aligning contactor layer 110 (402) with package substrate 106. In one embodiment, a jig with tight tolerances is used to align contactor layer 110 with package substrate 106.

Next, contactor layer 110 is bonded (404) to package substrate 106. In one embodiment, adhesive is placed near edges of contactor layer 110 to bond contactor layer 110 with package substrate 106 for iterative use with many integrated circuit dice 102.

Integrated circuit die 102 is then placed (406) on contactor layer 110, conductively coupling die contacts 104 with substrate contacts 108 through conductive elements in contactor layer 110. In one embodiment, a jig is used to align die contacts 104 with substrate contacts 108.

Integrated heat spreader 114 is then placed (408) over integrated circuit die 102. Then, integrated heat spreader 114 is bonded (410) to package substrate 106. In one embodiment, attach mechanism 112 is an adhesive applied to the surface of package substrate 106 that bonds with integrated heat spreader 114. In another embodiment attach mechanism 112 is a screw or pin that holds integrated heat spreader 114 and package substrate 106 together. In another embodiment, attach mechanism 112 uses magnetism to hold integrated heat spreader 114 and package substrate 106 together. In other embodiments, a suitable holding force is achieved to guarantee adequate electrical contact through other means.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   placing an integrated circuit die on a contactor layer, the contactor layer to electrically couple contacts on the integrated circuit die with contacts on a multi-layer substrate designed to be permanently attached with the integrated circuit die, wherein the contactor layer comprises a polymer sheet containing metal beads;
   placing an integrated heat spreader over the integrated circuit die;
   bonding the integrated heat spreader with the substrate, the integrated heat spreader holding the integrated circuit die in place to form a temporary package; and
   placing the temporary package into a tester socket.

2. The method of claim 1, further comprising testing the integrated circuit die.

3. The method of claim 1, wherein bonding the integrated heat spreader with the substrate comprises attaching the integrated heat spreader with the substrate with adhesive.

4. The method of claim 1, wherein placing an integrated heat spreader over the integrated circuit die comprises placing an integrated heat spreader designed to be permanently attached with the integrated circuit die over the integrated circuit die.

5. The method of claim 1, further comprising:
   placing an active thermal control in contact with the integrated heat spreader; and
   testing a thermal tolerance of the integrated circuit die.

6. The method of claim 1, further comprising:
   disassembling the temporary package; and
   replacing the integrated circuit die with a second integrated circuit die.

7. A method comprising:
   placing an integrated circuit die on a contactor layer, the contactor layer to electrically couple contacts on the integrated circuit die with contacts on a multi-layer substrate designed to be permanently attached with the integrated circuit die, wherein the contactor layer comprises a polymer sheet containing metal beads;
   placing an integrated heat spreader over the integrated circuit die;
   bonding the integrated heat spreader with the substrate, the integrated heat spreader holding the integrated circuit die in place to form a temporary package;
   placing the temporary package into a tester socket; and
   running tests to qualify the integrated circuit die as being a known good die.

8. The method of claim 7, wherein running tests to qualify the integrated circuit die as being a known good die comprises testing the integrated circuit die at a higher frequency than a bin frequency at which the integrated circuit die is to be marketed.

9. The method of claim 7, wherein running tests to qualify the integrated circuit die as being a known good die comprises testing signal quality through each of the contacts on the integrated circuit die.

10. The method of claim 7, further comprising:
    placing an active thermal control in contact with the integrated heat spreader; and
    testing a thermal tolerance of the integrated circuit die.

11. The method of claim 7, further comprising disassembling the temporary package.

12. The method of claim 11, further comprising:
classifiying the integrated circuit die as a known good die, if a test results are passing; and
reforming the temporary package with a second integrated circuit die.

13. The method of claim 12, further comprising bonding the known good die with another instance of the multi-layer substrate to form a permanent package.

* * * * *